United States Patent
Lin

(10) Patent No.: US 8,487,702 B2
(45) Date of Patent: Jul. 16, 2013

(54) TRANSIMPEDANCE AMPLIFIER AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 56 days.

(21) Appl. No.: 13/238,780

(22) Filed: Sep. 21, 2011

(65) Prior Publication Data
US 2013/0069727 A1    Mar. 21, 2013

(51) Int. Cl.
*H03F 1/22* (2006.01)
(52) U.S. Cl.
USPC .......................................... 330/288; 330/277
(58) Field of Classification Search
USPC .................. 330/277, 311, 288, 296
See application file for complete search history.

(56) References Cited

U.S. PATENT DOCUMENTS

| | | | |
|---|---|---|---|
| 7,764,091 B2 * | 7/2010 | Jiang | 327/129 |
| 7,898,339 B2 * | 3/2011 | Ikeda et al. | 330/285 |
| 8,086,207 B2 * | 12/2011 | Muthali et al. | 455/323 |
| 8,283,946 B2 * | 10/2012 | Lee | 326/81 |

* cited by examiner

*Primary Examiner* — Khanh V Nguyen
(74) *Attorney, Agent, or Firm* — McClure, Qualey & Rodack, LLP

(57) ABSTRACT

A transimpedance method and apparatus are provided. In one implementation an apparatus includes a common-gate amplifier for receiving a first current from a first circuit node and outputting a second current to a second circuit node, and a load circuit coupled to the second circuit node, the load circuit comprising a diode-connected MOS (metal-oxide semiconductor field effect transistor), wherein a gate terminal of the MOS is coupled to a drain terminal of the MOS via a resistor. In one embodiment, a current-mode input is injected to the first circuit node and the apparatus further comprises a biasing circuit for outputting a substantially constant current to the first circuit node.

17 Claims, 4 Drawing Sheets

TRANSIMPEDANCE AMPLIFIER AND METHOD THEREOF

FIELD OF TECHNOLOGY

This disclosure relates generally to method and apparatus of transimpedance amplifiers.

BACKGROUND

Transimpedance amplifiers (TIA) are widely used in optical communications. A TIA receives a current-mode input signal and outputs a voltage-mode signal. A prior art TIA 100 is depicted in FIG. 1. TIA 100 comprises: a bias circuit 110 comprising a current source 111 for establishing a substantially constant current $I_b$ flowing from circuit node 101 to circuit node $V_{SS}$; a common-gate amplifier 120 comprising a NMOS (short for n-type metal-oxide semiconductor field effect transistor) 121, wherein a gate terminal is coupled to a bias voltage VB, a source terminal is coupled to circuit node 101, and a drain terminal is coupled to circuit node 102; and a load circuit 130 comprising a resistor 131 coupling between circuit node $V_{DD}$ and circuit node 102. Throughout this disclosure, $V_{SS}$ denotes a first substantially fixed-potential circuit node that is commonly referred to as a "ground node"; and $V_{DD}$ denotes a second substantially fixed-potential circuit node that is commonly referred to as "power supply node." A current-mode input signal is injected into circuit node 101, while a voltage-mode output signal is generated at circuit node 102. The input current is denoted as $I_i$ and the resistance value of resistor 131 is denoted as R.

Note that an output current of a current source is substantially constant unless an output voltage changes too fast or too much. Assuming the input current is sufficiently small and changes sufficiently slow, then an output current $I_o$ of the common-gate amplifier 120 at circuit node 102 will be approximately $I_b-I_i$, and therefore the output voltage will be approximately $V_{DD}-(I_b-I_i) \cdot R$, indicating the small-signal gain of TIA 100 is approximately equal to R. However, if the input current changes too rapidly, current source 111 may not be able to keep a constant output current. The gain of TIA 100, in other words, is band limited. To increase the speed of TIA 100, requires the common-gate amplifier 120 to have a higher transconductance, which requires a higher bias current, i.e. a larger $I_b$. With a higher bias current, however, the resistance value of resistor 131 needs to be smaller due to the limited headroom constrained by the voltage difference between $V_{DD}$ and $V_{SS}$. This would prevent TIA 100 from having a high gain, as the gain of TIA 100 is proportional to the resistance value of resistor 131. In summary, there is a tight constraint on the gain of TIA 100 due to limited voltage headroom when one seeks to increase the speed of TIA 100, since the voltage headroom used by the load circuit 130 is proportional to the bias current $I_b$.

What is desired is a TIA with more headroom for higher gain when one seeks to increase the speed.

SUMMARY

In one embodiment, an apparatus comprises: a common-gate amplifier for receiving a first current from a first circuit node and outputting a second current to a second circuit node, and a load circuit coupled to the second circuit node, the load circuit comprising a diode-connected MOS (metal-oxide semiconductor field effect transistor), wherein a gate terminal of the MOS is coupled to a drain terminal of the MOS via a resistor. In a first further embodiment, a current-mode input is injected to the first circuit node and the apparatus further comprises a biasing circuit for outputting a substantially constant current to the first circuit node.

In a second embodiment, a current-mode input is injected to a third circuit node and the apparatus further comprises: a biasing circuit for outputting a substantially constant current to the third circuit node, and a current mirror for receiving a third current from the third circuit node and outputting the first current to the first circuit node.

In another embodiment, a method comprises: receiving a first current from a first circuit node; amplifying the first current using a common-gate amplifier to output a second current to a second circuit node; and converting the second current into a voltage-mode output at the second circuit node by using a load circuit coupled to the second circuit node, the load circuit comprising a diode-connected MOS, wherein a gate terminal of the MOS is coupled to a drain terminal of the MOS via a resistor.

In a further embodiment, the method further comprises injecting a current-mode input into the first circuit node and establishing a substantially constant current to the first circuit node using a biasing circuit. In a second further embodiment, the method further comprises: injecting a current-mode input to a third circuit node; establishing a substantially constant current to the third circuit node; and outputting the first current to the first circuit node by current-mirroring a third current from the third circuit node.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 2A:
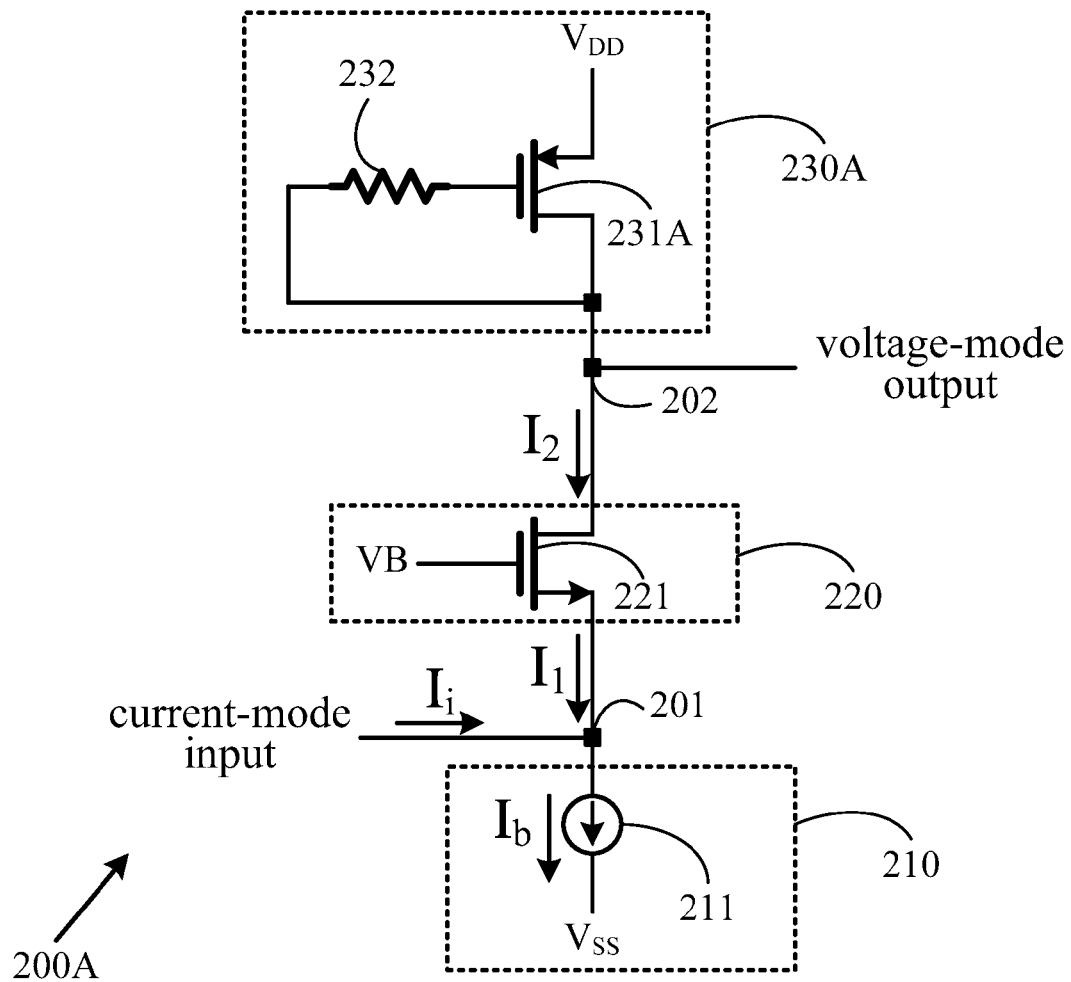
FIG. 2A shows an embodiment of TIA in accordance with the present invention.

A TIA 200A in accordance with an embodiment of the present invention is depicted in FIG. 2A. TIA 200A receives a current-mode input at a first circuit node 201 and outputs a voltage-mode output at a second circuit node 202. TIA 200A includes a common-gate amplifier 220 having an NMOS (n-type metal-oxide semiconductor field effect transistor) 221 for receiving a first current $I_1$ from the first circuit node 201 and outputting a second current $I_2$ to the second circuit node 202, wherein a gate terminal of NMOS 221 is coupled to a bias voltage node VB, a source terminal of NMOS 221 is coupled to the first circuit node 201, and a drain terminal of NMOS 221 is coupled to the second circuit node 202. The TIA further includes a load circuit 230A having a PMOS (p-type metal-oxide semiconductor field effect transistor) 231A configured in a diode-connected configuration for receiving the second current $I_2$ and outputting the output voltage at the second circuit node 202, wherein a source terminal of PMOS 231A is coupled to a power supply node $V_{DD}$, a drain terminal of PMOS 231A is coupled to the second circuit node 202, and a gate terminal of PMOS 231A is coupled to the drain terminal of PMOS 231A via a resistor 232. TIA 200A further comprises a biasing circuit 210 comprising a current source 211 for establishing a substantially constant current $I_b$ flowing from the first circuit node 201 to a ground node $V_{SS}$. For a conventional diode-connected PMOS, the drain terminal is directly connected to the gate terminal. In TIA 200A, however, resistor 232 is used to couple the drain terminal to the gate terminal for PMOS 231A. The purpose of resistor 232 is to provide isolation between the gate terminal and the drain terminal of PMOS 231A, so as to lessen capacitive load at the second circuit node 202. If the drain terminal was directly connected to the gate terminal without using the resistor 232 for isolation, a parasitic capacitance at the gate terminal of PMOS 231A would cause a heavy capacitive load to the second circuit node 202 and adversely slow down the circuit speed.

Figure 1:
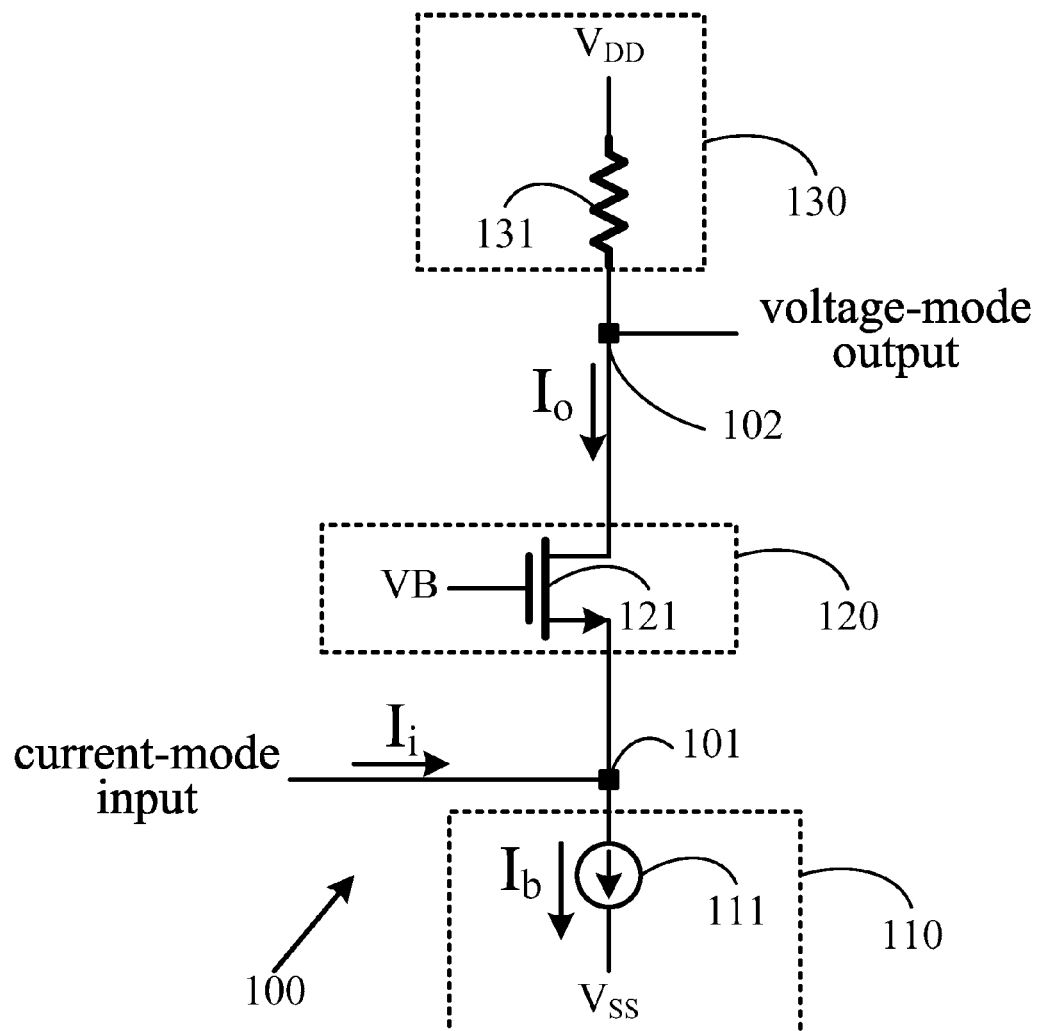
FIG. 1 shows a prior art TIA (transimpedance amplifier).

To increase the speed of TIA 200A, the bias current $I_b$ can be increased. Unlike TIA 100 of FIG. 1 where the load circuit 130 comprises a resistor and the voltage headroom used by the load circuit 130 is proportional to the bias current, in TIA 200A of FIG. 2A the load circuit 230A comprises a diode-connected PMOS and the voltage headroom used by the load circuit 230A only increases modestly when one increases the bias current, thanks to the nature of the diode-connected configuration. Therefore, the speed of TIA 200A can be increased without much sacrifice in gain. In an alternative embodiment 200B shown in FIG. 2B, load circuit 230A is replaced with an alternative load circuit 230B comprising a NMOS 231B configured in a diode-connected configuration, where a drain terminal of the NMOS 231B is coupled to the power supply node $V_{DD}$, a source terminal of the NMOS 231B is coupled to the second circuit node 202, and a gate terminal of the NMOS 231B is coupled to the drain terminal of the NMOS 231B via resistor 232.

Figure 3:
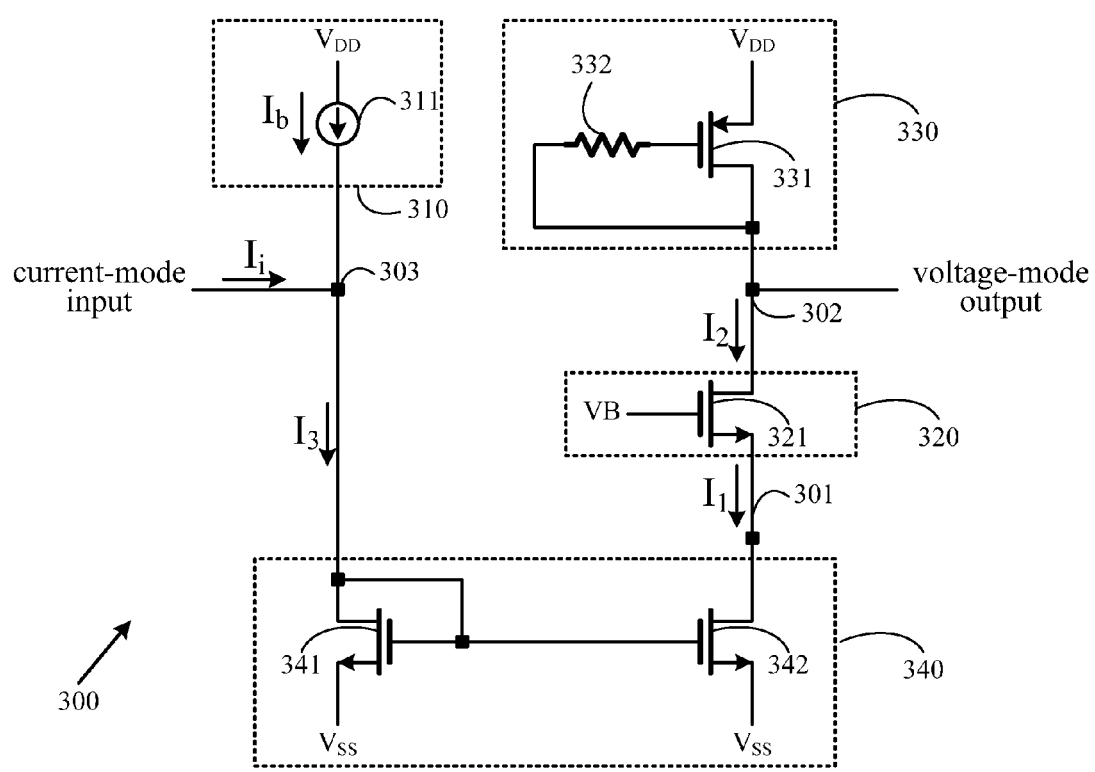
FIG. 3 shows an alternative embodiment of TIA.

An alternative embodiment TIA 300 is depicted in FIG. 3. TIA 300 comprises: a common-gate amplifier 320 comprising a NMOS (n-type metal-oxide semiconductor field effect transistor) 321 for receiving a first current $I_1$ from a first circuit node 301 and outputting a second current $I_2$ to a second circuit node 302, wherein a gate terminal of NMOS 321 is coupled to a bias voltage node VB, a source terminal of NMOS 321 is coupled to the first circuit node 301, and a drain terminal of NMOS 321 is coupled to the second circuit node 302; and a load circuit 330 comprising a PMOS (p-type metal-oxide semiconductor field effect transistor) 331 configured in a diode-connected configuration for receiving the second current $I_2$ and outputting an output voltage at the second circuit node 302, wherein a source terminal of PMOS 331 is coupled to a power supply node $V_{DD}$, a drain terminal of PMOS 331 is coupled to the second circuit node 302, and a gate terminal of PMOS 331 is coupled to the drain terminal of PMOS 331 via a resistor 332. TIA 300 further comprises: a biasing circuit 310 comprising a current source 311 for establishing a substantially constant current $I_b$ flowing from power supply node $V_{DD}$ to a third circuit node 303, and a current mirror 340 for receiving a third current $I_3$ from the third circuit node 303 and outputting the first current $I_1$ to the first circuit node 301. The current mirror 340 comprises a first NMOS 341 configured in a diode-connected topology for converting the third current into a voltage signal and a second NMOS 342 configured in a common-source amplifier configuration for converting the voltage signal into the first current. The principle of current mirror is well known to those of ordinary skills in the art and thus not explained in detailed here. A current-mode input $I_i$ is injected to the third circuit node 303. If the dimensions of the first NMOS 341 are identical to those of the second NMOS 342, then the first current $I_1$ will be approximately equal to the third current $I_3$, which is substantially equal to $I_b+I_i$. In this case, TIA 300 is functionally equivalent to TIA 200A, except that the polarity of the current-mode input signal $I_i$ is reversed due to using a current mirror.

An advantage of TIA 300 of FIG. 3 over TIA 200A of FIG. 2A is a higher level of flexibility in the gain of TIA due to using current mirror, because the gain of the current mirror can be adjusted by properly choosing a relative ratio of W/L (width-to-length ratio) of the second NMOS 342 with respect to W/L of the first NMOS 341. For instance, if second NMOS 342 is of the same length as that of first NMOS 341 but is twice as large in width, then W/L of second NMOS 342 is twice as large as W/L of first NMOS 341 and consequently the first current $I_1$ will be approximately twice as large as the third current $I_3$; in this case, a current gain of two is realized and the overall gain of TIA 300 is doubled due to using the current mirror. In a yet alternative embodiment not shown in figure, load circuit 330 is replaced with an alternative load circuit comprising a NMOS configured in a diode-connected configuration, where a drain terminal of the NMOS is coupled to the power supply node $V_{DD}$, a source terminal of the NMOS is coupled to the second circuit node 302, and a gate terminal of the NMOS is coupled to the drain terminal of the NMOS via a resistor.

Figure 2B:
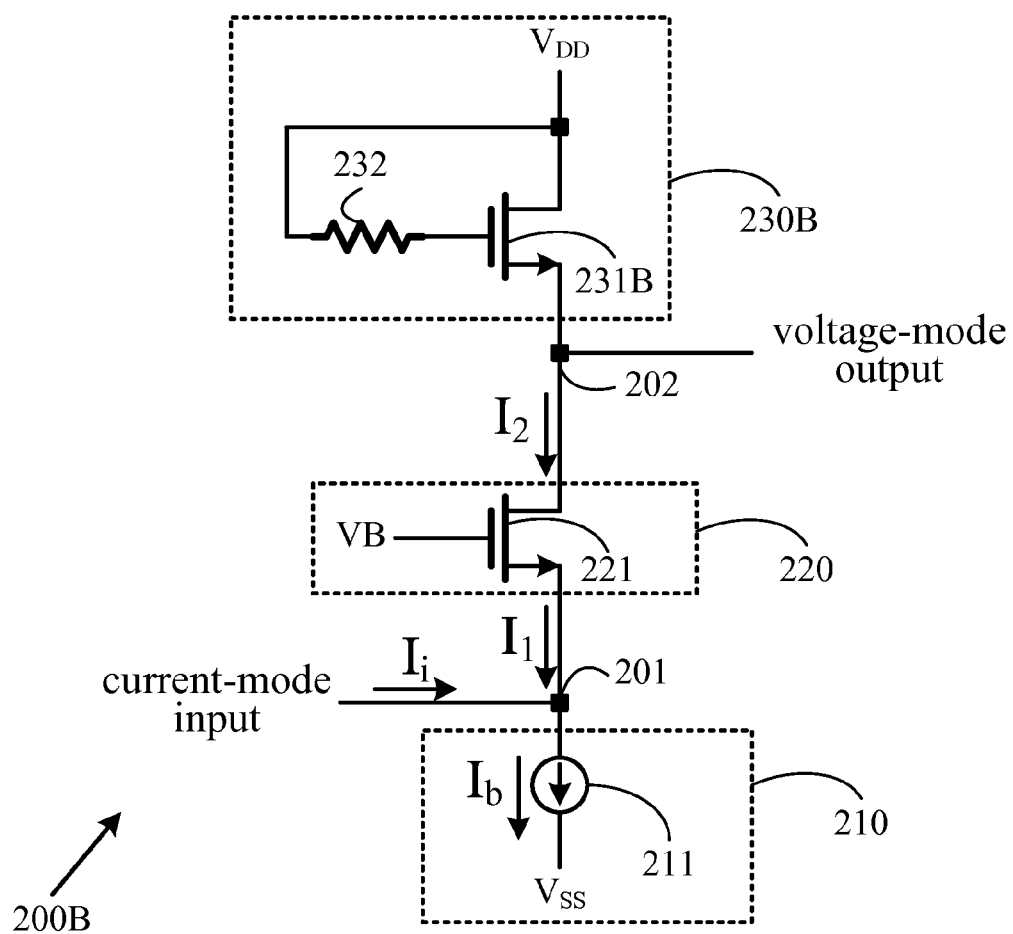
FIG. 2B shows a variant to the TIA of FIG. 2A.

In embodiments of TIA 200A of FIG. 2A, TIA 200B of FIG. 2B, and TIA 300 of FIG. 3, MOS transistors are used. In these embodiments, one may choose to replace a NMOS with a NPN BJT (bipolar junction transistor) or replace a PMOS with a PNP BJT, if applicable. A common-base BJT amplifier may replace a common-gate MOS, because their functions are similar. Also, a common-emitter BJT amplifier may replace a common-source MOS, because their functions are similar. Likewise, a diode-connected PNP BJT may replace a diode-connected PMOS, and a diode-connected NPN BJT may replace a diode-connected NMOS.

Embodiment of current source is well known to those of ordinary skills in the art and thus not described in detail here.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
   a common-gate amplifier for receiving a first current from a first circuit node and outputting a second current to a second circuit node;
   a load circuit coupled to the second circuit node, the load circuit comprising a diode-connected MOS transistor, wherein a gate terminal of the MOS transistor is coupled to a drain terminal of the MOS transistor via a resistor; and
   a current mirror for receiving a third current from a third circuit node and outputting the first current to the first circuit node.

2. The apparatus of claim 1, wherein a drain terminal of the MOS transistor is coupled to the second circuit node and a source terminal of the MOS transistor is coupled to a substantially fixed potential node.

3. The apparatus of claim 1, wherein a source terminal of the MOS transistor is coupled to the second circuit node and the drain terminal of the MOS transistor is coupled to a substantially fixed potential node.

4. The apparatus of claim 1 further comprising a biasing circuit for outputting a substantially fixed current to the first circuit node, wherein a current-mode input is injected to the first circuit node.

5. The apparatus of claim 4, wherein the biasing circuit is a current source.

6. The apparatus of claim 1 further comprising:
a biasing circuit for outputting a substantially fixed current to the third circuit node, wherein a current-mode input is injected to the third circuit node.

7. The apparatus of claim 6, wherein the current mirror comprises a first MOS transistor configured in a diode-connected configuration for converting the third current into a voltage signal and a second MOS transistor configured in a common-source amplifier configuration for converting the voltage signal into the first current.

8. The apparatus of claim 7, wherein the first MOS transistor and the second MOS transistor have the same width-to-length ratio so that the first current is substantially equal to the third current.

9. The apparatus of claim 7, wherein a gain of the apparatus is adjusted by choosing a width-to-length ratio of the second MOS transistor that is different from a width-to-length ratio of the first MOS transistor.

10. The apparatus of claim 1, wherein the resistor is sufficiently large to provide isolation between the gate terminal of the diode-connected MOS transistor and the second circuit node.

11. A method comprising:
receiving a first current from a first circuit node;
amplifying the first current using a common-gate amplifier to output a second current to a second circuit node;
converting the second current into a voltage-mode output at the second circuit node by using a load circuit coupled to the second circuit node, the load circuit comprising a diode-connected MOS transistor, wherein a gate terminal of the MOS transistor is coupled to a drain terminal of the MOS transistor via a resistor; and
converting a third current from a third circuit node into the first current using a current mirror.

12. The method of claim 11, wherein the drain terminal of the MOS transistor is coupled to the second circuit node and a source terminal of the MOS transistor is coupled to a substantially fixed potential node.

13. The method of claim 11, wherein a source terminal of the MOS transistor is coupled to the second circuit node and the drain terminal of the MOS transistor is coupled to a substantially fixed potential node.

14. The method of claim 11 further comprising:
injecting a current-mode input into the first circuit node; and
establishing a substantially constant current to the first circuit node using a current source.

15. The method of claim 11 further comprising:
injecting a current-mode input into a third circuit node; and
establishing a substantially constant current to the third circuit node using a current source.

16. The method of claim 15, wherein the current mirror comprises: a first MOS transistor configured in a diode-connected configuration for converting the third current into a voltage signal; and a second MOS transistor configured in a common-source amplifier configuration for converting the voltage signal into the first current.

17. The method of claim 16 further comprising adjusting a gain of the current mirror by adjusting a ratio of the width-to-length ratio of the second MOS transistor to the width-to-length ratio of the first MOS transistor.

* * * * *